United States Patent [19]
Ehlert et al.

[11] Patent Number: 5,168,344
[45] Date of Patent: Dec. 1, 1992

[54] CERAMIC ELECTRONIC PACKAGE DESIGN

[75] Inventors: Michael R. Ehlert, Irvine, Calif.; Jack H. Enloe, Columbia, Md.; Alan L. Kovacs, Long Beach, Calif.; John W. Lau, Gaithersburg, Md.

[73] Assignee: W. R. Grace & Co. Conn., New York, N.Y.

[21] Appl. No.: 567,518

[22] Filed: Aug. 15, 1990

[51] Int. Cl.$^5$ ............................................. H01L 23/02
[52] U.S. Cl. .................................. 257/693; 257/700; 257/704; 257/705
[58] Field of Search ..................... 357/74, 80, 72, 68, 357/84

[56]  References Cited
U.S. PATENT DOCUMENTS

| | | | |
|---|---|---|---|
| 4,076,955 | 2/1978 | Gates, Jr. | 357/74 |
| 4,340,902 | 7/1982 | Honda et al. | 357/80 |
| 4,649,417 | 3/1987 | Burgess et al. | 357/80 |
| 4,695,872 | 9/1987 | Chatte jee | 357/80 |
| 4,999,700 | 3/1991 | Dunaway et al. | 357/70 |

Primary Examiner—Andrew J. James
Assistant Examiner—T. Davenport
Attorney, Agent, or Firm—Steven Capella

[57] ABSTRACT

Hermetic package designs for HDMI substrates are discussed. The designs for a hermetically sealed, perimeter-leaded package may have the following features:
a) a flat monolithic dielectric base, the base having a flat upper surface and a flat lower surface;
b) a zone on the upper surface, in which zone the HDMI device would reside;
c) a seal ring surrounding the zone;
d) a cover adapted to be hermetically sealed to the seal ring, thereby protecting the HDMI device located in the zone;
e) a plurality of conductive vias (inner vias) extending from the upper surface inside said zone downwardly toward the lower surface;
f) a plurality of perimeter conductive lead pads located on or in the upper surface about the perimeter of the zone inside the seal ring; wherein
 (1) the perimeter lead pads are electrically connected to the inner vias, and
 (2) the inner vias are electrically connected to a surface of the base outside the zone.

12 Claims, 6 Drawing Sheets

CERAMIC ELECTRONIC PACKAGE DESIGN

The invention was made with Government support under Contract No. N66001-88-C-0181 awarded by Naval Ocean Systems Center, Department of the Navy. The Government has certain rights in the invention.

FIELD OF THE INVENTION

This invention is directed to the design of hermetic ceramic packages for housing integrated circuit devices, and in particular, integrated circuit devices which have large dimensions and/or high heat loads.

BACKGROUND OF THE INVENTION

In recent years, considerable activity has been devoted to utilization of silicon as a substrate for mounting discrete integrated circuit devices and for interconnection of devices. This approach has been referred to by several names, including silicon multichip module, silicon-on-silicon, hybrid wafer scale integration, high-density multichip interconnect (HDMI), silicon interconnect substrate, etc. The approach involves the building up of layers of metal conductor lines and low dielectric constant polymers (e.g., polyimides) on a large silicon wafer substrate. The conductive traces provide interconnection between discrete integrated circuit devices (chips) which are mounted on top of those layers.

In this patent disclosure, the term "HDMI device" shall refer to the combination of a silicon substrate, polymer/metal interconnect layers, and integrated circuit devices (chips) mounted on those layers.

As with most integrated circuit devices, HDMI devices often are mounted in packages designed to hermetically protect the devices and to provide multiple electrical connections from the device to the outside world.

HDMI devices are typically designed to contain several chips mounted on multiple polymer layers on a large silicon substrate. The substrate is usually quite large (having lateral dimensions of about 1 to 4 inches). Additionally, the chips mounted on the upper surface create a topographically varying surface.

These features of HDMI devices create several packaging problems as compared to single chip packaging. Since the substrate is large, there is greater potential for build-up of stress due to differences in thermal expansion coefficient between the substrate and the base of the package. Thus, there is a greater need for the package base to have good thermal expansion match to silicon add high thermal conductivity. Thermal expansion matching to silicon is desired to prevent substantial stresses and mechanical failures upon heating (either during package assembly or actual operation of the device). High thermal conductivity in the package is highly desired since it also can help minimize development of stresses at the package-silicon interface by effective heat removal.

High flexural strength and Young's modulus are desired to prevent excessive flexing and breakage of the HDMI device in use. Additionally, a highly flat package base is desired to achieve good bonding across the large silicon substrate. Other advantages of a flat package base will be discussed below.

The package dielectric should have low dielectric constant and loss to prevent signal propagation delays in the conductive traces and cross-talk between neighboring conductors. Use of a good dielectric also gives the potential for multiple layers of conductive traces in the package.

The package must provide adequate means for input and output of electrical signals from the chips and layered interconnecting portions of the HDMI device to points outside the hermetically sealed area. For HDMI devices, high lead density often is required for perimeter-leaded packages (i.e. packages having leads located about the inside perimeter of the hermetically sealed area) because the multichip configuration greatly reduces the amount of available perimeter length per chip for location of lead pads.

Figure 1:
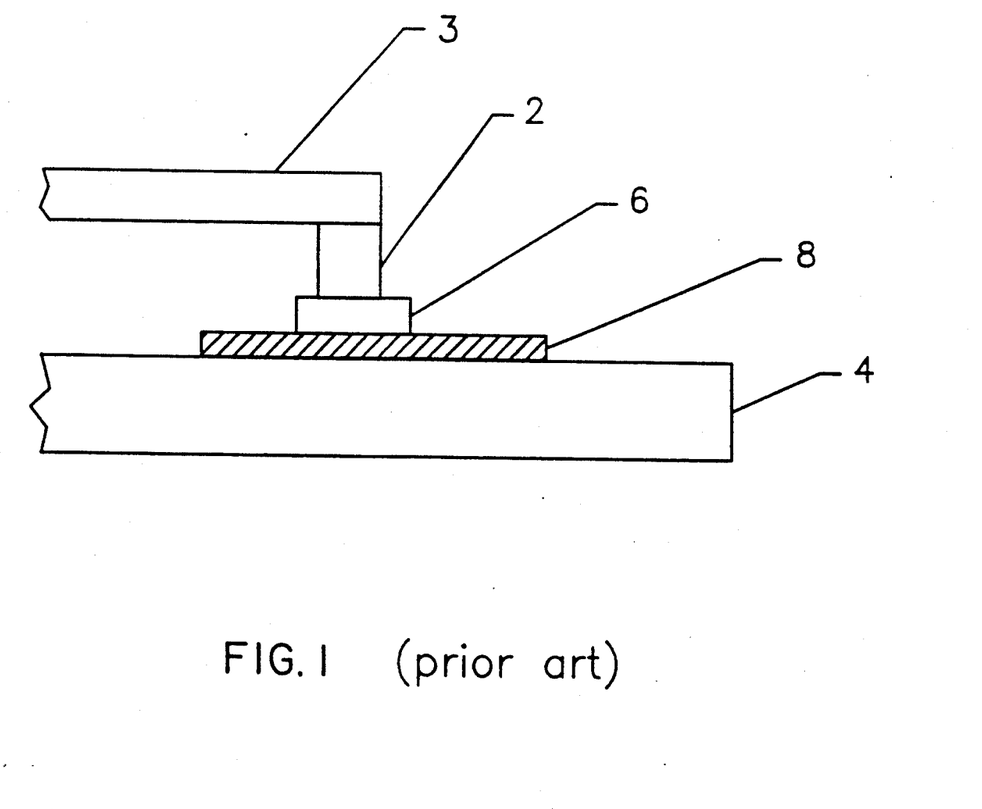
FIG. 1 shows a cross-section of a prior art perimeter-leaded package design where a perimeter lead trace traverses the ceramic base underneath the seal ring.

In the past, perimeter-leaded package designs often suffered from a lack of hermeticity along the conductive paths formed from the perimeter leads to the exterior surface of the package base (i.e., outside the hermetically sealed zone). See FIG. 1 showing lead (8) traversing ceramic sealing portion (6) of package base (4). (Cover (3) and seal ring (2) are designed to seal the hermetic zone.) The lack of hermeticity is believed to be caused by a lack of sufficient bonding between the surface metallization forming the conductive path and the ceramic dielectric package base such that continuous cracks can be formed along this interface. This problem can be exacerbated in the event that poor chemical bonding occurs between the metallization and the ceramic base.

Figure 2:
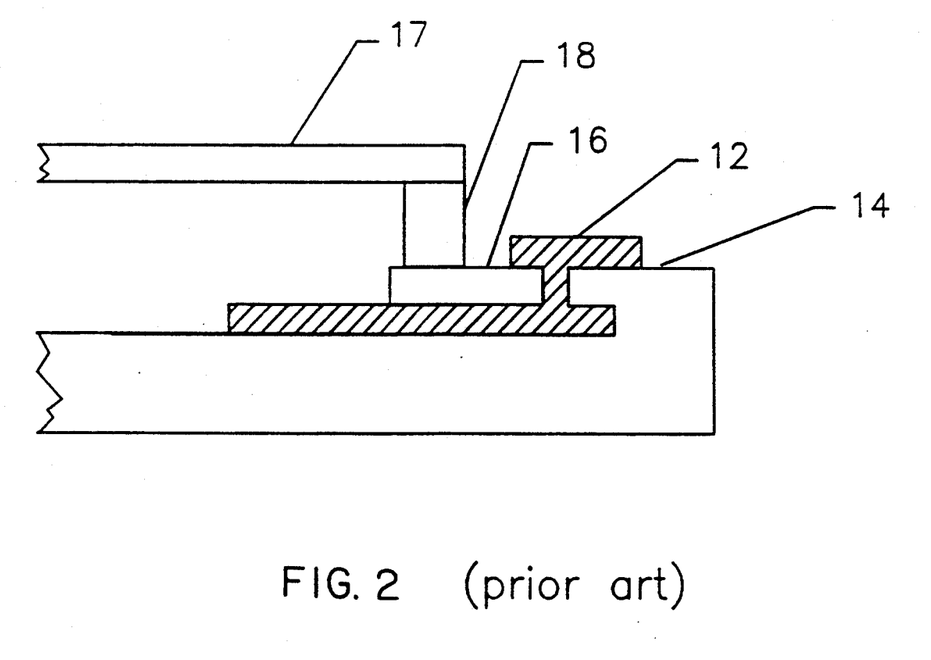
FIG. 2 shows a cross-section wherein a perimeter lead trace traverses underneath the seal ring of a prior art perimeter-leaded package having an elaborate seal ring/lead configuration.

Other perimeter-leaded designs, such as shown in FIG. 2, involved construction of very elaborate vias (12) in the non-flat perimeter portions (16) of the package (14). (Seal ring 18 and cover 17 are designed to seal the hermetic zone.) Needless to say, such designs required more elaborate fabrication techniques. Neither of the prior art designs use a flat dielectric base, but rather both have elevated perimeter dielectric portions.

Packages having such non-flat dielectric bases often suffer from a lack of hermeticity in the dielectric base itself. Since non-flat bases usually have to be pressureless sintered, they have greater chance for delamination of the tape layers forming the base. Additionally, non-uniform bonding or shrinkage of tape layers can cause microcracking in the dielectric base. When these defects are present, there is a greater chance for formation of discontinuity paths in the package. Such discontinuity paths can destroy the hermeticity of the package by allowing contaminants such as water to migrate into the sealed zone.

For large packages (e.g., at least 2 inches×2 inches) designed to house HDMI devices, control of the dielectric base flatness to less than or equal to 0.001 inches deviation per inch of lateral position is desired to ensure good mechanical attachment of the substrate at the dielectric base. The very flat dielectric base and good mechanical contact provide a larger surface area of contact and therefore greater effective thermal conduction at the base-substrate interface. Pressureless sintering techniques typically result in about 0.002 inches/inch flatness which is inadequate for large packages. In addition, control of the positioning of ceramic and metal features co-fired in conventional sintering is typically limited to 0.25 to 0.5% of the lateral dimension of the package. For large packages, this limited precision places a lower limit on the attainable lead spacing, and therefore, an upper limit on the total number of lead pads (I/O's).

U.S. Pat. No. 4,920,640 offers an alternative approach to conventional co-firing by pressureless sintering. In this method, a uniaxial pressure is applied to the package preform during the high temperature densification process. This pressure effectively eliminates lateral shrinkage, thus providing much tighter control on the positioning of co-fired metal features. The applied pressure also serves to significantly decrease warpage in the fired part. This process has been demonstrated for co-firing of AlN with refractory metals.

SUMMARY OF THE INVENTION

The present invention overcomes the various deficiencies described above regarding hermetic package design.

In one aspect, the invention embraces a design for a hermetically sealed, perimeter-leaded package for maintaining an HDMI device in an electrically accessible, hermetically sealed environment comprising
 a) a flat monolithic dielectric base, the base having a flat upper surface and a flat lower surface;
 b) a hermetic zone (or space on at least a portion of the upper surface, in which zone the HDMI device would reside;
 c) a seal ring surrounding and defining dimension of the zone on the upper surface;
 d) a cover adapted to be hermetically sealed to the seal ring, thereby covering the zone and protecting the HDMI device located in the zone;
 e) a plurality of conductive vias (inner vias) extending from said upper surface inside said zone downwardly toward said lower surface;
 f) a plurality of perimeter conductive lead pads located on or in said upper surface in the zone about the perimeter of the zone; wherein
  (1) the perimeter lead pads are electrically connected to the inner vias, and
  (2) the inner vias are electrically connected to a surface of the base outside the zone.

In another aspect, the invention encompasses package designs having high perimeter lead densities and/or close lead spacings.

The invention further encompasses package designs where the inner vias are connected by various configurations of metallization buried within the dielectric base to various lead pad configurations on package surface outside the hermetic zone. The configurations of buried metallization may include combinations of vias, metallization traces (lines), planes of metallization, or other known metallization forms.

In a further aspect, the invention encompasses packages having lateral base dimensions of two inches or more. A further preferred aspect encompasses packages having at least one lateral dimension of three to four inches or more.

In one preferred embodiment, the perimeter lead pads are connected by inner vias, buried trace metallization and outer vias to the upper surface outside the hermetic zone.

Further, the invention encompasses package designs using hot-pressed AlN as the dielectric base material.

These and other aspects of the invention are further described below.

DESCRIPTION OF THE PREFERRED EMBODIMENTS

The improved perimeter-leaded package design of the invention is described with respect to FIGS. 3-6. The following description and the figures are intended to illustrate particular embodiments of the invention. The invention is not limited to these particular embodiments.

Figure 3:
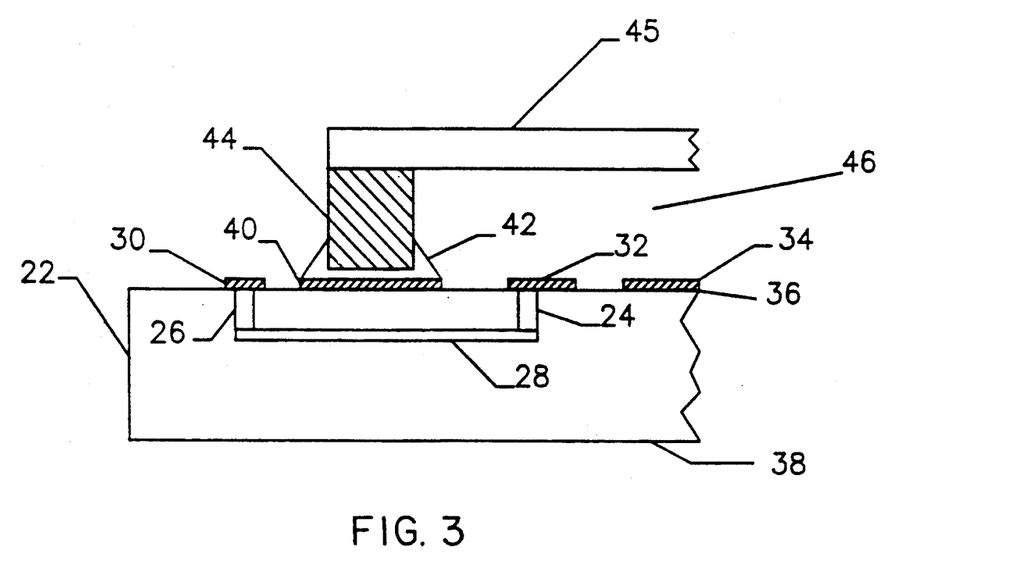
FIG. 3 shows a cross-section where a perimeter lead trace traverses underneath the seal ring of a package design of the invention from the outer edge of the base to inside the seal ring.

Referring to FIG. 3, the package preferably has a flat monolithic dielectric base 22 having an upper surface 36 and a lower surface 38. A layer of metallization 40 defines the location of seal ring 44 which is attached by seal ring braze material 42.

Seal ring 44 defines a hermetic zone 46 in which the HDMI device would be attached. Since the cross-section shown in FIG. 3 represents only part of a total cross-section of the package, it should be understood that seal ring 44 entirely surrounds zone 46 on upper surface 36. See FIGS. 5 and 6. The upper and lower boundaries of the zone are defined by cover 45 and upper surface 36. See FIGS. 5 and 6. The upper and lower boundaries of the zone are defined by cover 45 and upper surface 36.

Metallized substrate attachment area 34 is located on upper surface 36 within zone 46. An HDMI device would be attached to base 22 at area 34. Surrounding attachment area 34 yet within zone 46 are a plurality of perimeter lead pads 32 (only one shown in FIG. 3). Perimeter lead pads 32 would typically be connected to the HDMI device by brazed or soldered leads (not shown). Perimeter lead pads 32 are formed of a suitable electrically conductive material. Usually, perimeter lead pads 32 are formed from metallization applied to the dielectric base 22 in a post-firing process.

Perimeter lead pads 32 are connected to inner vias 24 (only one shown in FIG. 3). Inner vias 24 are preferably hermetic, conductive paths which lead from upper surface 36 in zone 46 down into base 22. Inner vias 24 may optionally extend to lower surface 38 for electrical access there.

Inner vias 24 are preferably connected to conductive traces 28 (only one shown in FIG. 3) within the body of base 22. The conductive traces 28 are further connected to outer vias 26 (only one shown in FIG. 3). The outer vias 26 are also preferably hermetic and electrically conductive, as are traces 28. Outer vias 26 lead to upper surface 36 outside seal band 44. At upper surface 36, outer vias 22 are connected to outer lead pads 30.

The combination of outer vias 26, conductive traces 28 and inner vias 24 form a hermetic, conductive path between hermetically sealed zone 46 and the exterior upper surface 36 of the package. One feature of the invention is that the combination of vias and traces establishes multiple barriers to leakage. In this manner, the design ensures enhanced and consistent hermeticity in the package.

Figure 4:
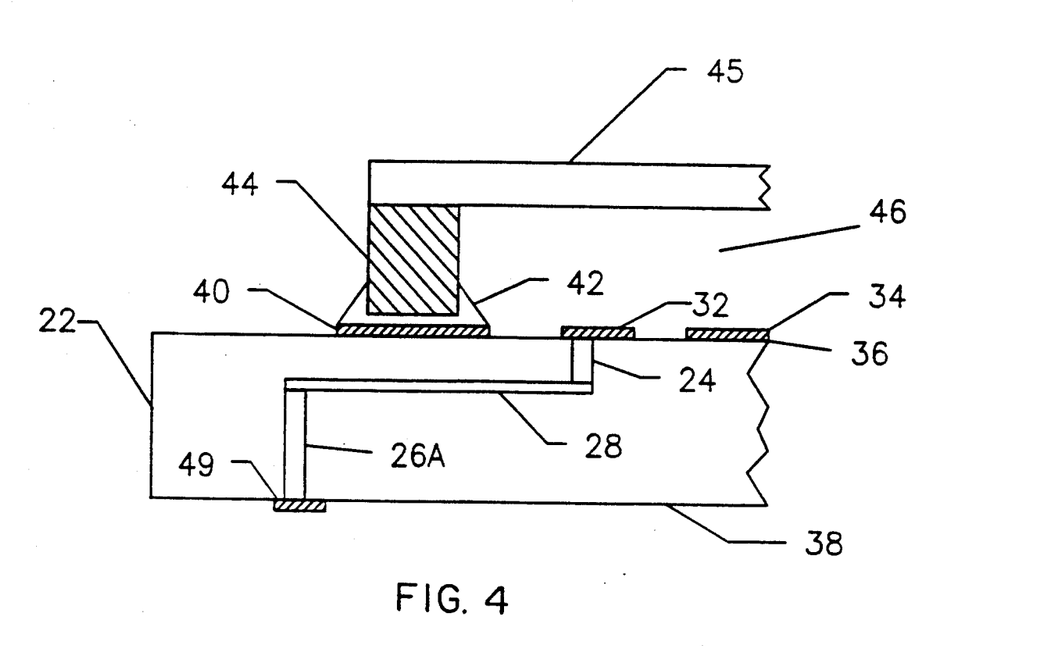
FIG. 4 shows a cross-section where a perimeter lead trace traverses underneath the seal ring of another embodiment of the invention from the outer edge of the base to inside the seal ring.

FIG. 4 shows one of many options in the design. Namely, via 26A travels down to lower surface 38 for contact at least pad 49.

The invention encompasses any permutation or variation in the connection of vias and conductive traces within the base 22. Any known electrical configuration for package circuitry may be included in the design. Any via may be connected to multiple traces or other vias. Additionally, any via may contact both upper and lower base surfaces and/or at more than one point on each surface. Lead pads may be placed on the lower surface to facilitate electrical connection. Examples of such variations include connection to a pad grid array on the lower surface 38.

The outer lead pads 30 are preferably connected to external leads (not shown) for input and output of electrical signals or power. Kovar alloys may be used to form the external leads.

A metal lid cover 45 can be attached to the seal ring 44 to completely enclose the electronic device. This can be done by welding the metal lid to seal ring 44. This allows the package to be reopened after final assembly if rework of the HDMI device is needed.

A major advantage of the design is that its flat monolithic structure allows for a separate application (for example, by screen printing) and firing of the surface metallization. This offers flexibility in processing so that optimum performance can be achieved in the surface metallization without compromising on the properties of the co-fired dielectric base. This is extremely important for AlN dielectric bases where relatively minor changes in firing temperature can have a significant effect on resultant thermal conductivity.

While AlN is the preferred material for the dielectric base because of its excellent combination of material properties, it is envisioned that other dielectrics may be suitable for use with this design as well. For instance, if the device operates at low power, the thermal properties of the dielectric may become less critical. As a result, selection of a less expensive ceramic dielectric may be appropriate.

Material selection for the seal ring is based in part on obtaining a good thermal expansion match to the dielectric base such that excessive stress or strain does not develop because of thermal excursions during processing or while in use. Selection is also dictated by compatibility with subsequent processing steps. These steps include: (1) braze firing for attachment of the seal ring to the package base (2) seam welding for attachment of the metal lid to the seal ring. Molybdenum provides a good thermal expansion match to AlN and can be brazed to using copper/silver braze alloys or other commonly used alloys. Other seal ring and braze combinations are also possible. For instance, kovar alloy has a reasonably good thermal expansion match with AlN up to 450° C., hence it is envisioned that it would work well with low temperature brazes (e.g., Au/Ge alloys, which fire in the range of approximately 350° to 400° C.).

The design described above can be produced using a variety of processing techniques. A preferred method for processing the dielectric base is by hot pressing as described in U.S. Pat. No. 4,920,640. That process involves production of a ceramic green sheet with a binder that leaves no undesirable residue upon pyrolysis in the absence of oxygen. Metallization can be applied to the green ceramic sheet by common methods such as screen printing of metal containing inks or pastes. The required vias can be produced by punching holes in the green sheet and filling with a metal-filled paste. After metallizing, a series of green sheets are brought together in good registration (alignment) as a preform and placed in a graphite die for hot pressing. Boron nitride (BN) sheets should be placed on both sides on the preform to prevent undesirable reactions with the graphite during the hot pressing. Hot pressing is carried out under conditions required to optimize the properties of the ceramic and co-fired metal.

In the case of AlN, the method additionally allows for simultaneous optimization of the properties of the AlN and the co-fired metallization. Material properties achieved include theoretical densities for the AlN (3.26 $gm/cm^3$), thermal conductivities ranging from 170 to 200 W/m-°K. and surface resistivities of the co-fired refractory metal leads of approximately 0.013 ohm/square. The refractory metallization is sufficiently dense so that no leakage through the buried metallization has been noted during helium leak testing.

Refractory metal metallization systems are capable of high adhesion strengths. These systems can be fired to relatively high density so that they become impervious to gas flow. Thus, hermetic packages are possible with the use of refractory surface metallization. Refractory metals are also compatible with common braze firing conditions for attachment of seal rings and leads.

Silicate glasses are sometimes used in refractory metal ink formulations to aid densification and to promote adhesion. Glass-bonded refractory metallizations have been shown to have high adhesion strength when fired on AlN under appropriate conditions. However, such glasses are not stable at the temperatures required to fire AlN to high thermal conductivity, and thus would be precluded from use in an AlN co-fire process. The present design allows for separate firing of glass-bonded refractory metals at temperatures which give optimum properties (i.e., approximately 1300° to 1400° C.). It should be noted that metallization systems not containing refractory metals may work as well. For instance, active metal braze alloys containing copper, silver and titanium have been shown to bond well directly to AlN, and thus they may serve as the surface metallization alone in this package design.

A lower firing temperature for the surface metallization is advantageous since it decreases the likelihood that a reduction in adhesion strength would result from thermal expansion mismatches between the dielectric and the surface metallization.

Using the above method, AlN prototypes measuring over 4 inches on a side have been regularly produced with control on the position of co-fired perimeter leads (0.012 inch wide, 0.030 cm) to better than 0.10% (relative) and on flatness to better than 0.001 inch (0.0025 cm). This degree of position control and flatness is better than what can be achieved by conventional co-firing by at least a factor of 2.

Using hot pressing allows precise placement of metallization within the dielectric base. Additionally, since the flat dielectric base allows for screening of post-fired metallization on the surfaces of the dielectric base, very fine and precise detail metallization can be achieved on the base surfaces. In this way, it is possible to achieve the high lead densities needed for HDMI device packages. Lead spacings of 30 mils or less can easily be produced by this process. Further, lead spacings of 20-25 mils or less can be consistently achieved regardless of package site.

The following example illustrates one method of fabricating a package encompassing the design of the invention. While the example refers to a specific method, the invention is not limited to a specific method of fabrication or to the particular design discussed in the example.

EXAMPLE 1

Figure 5:
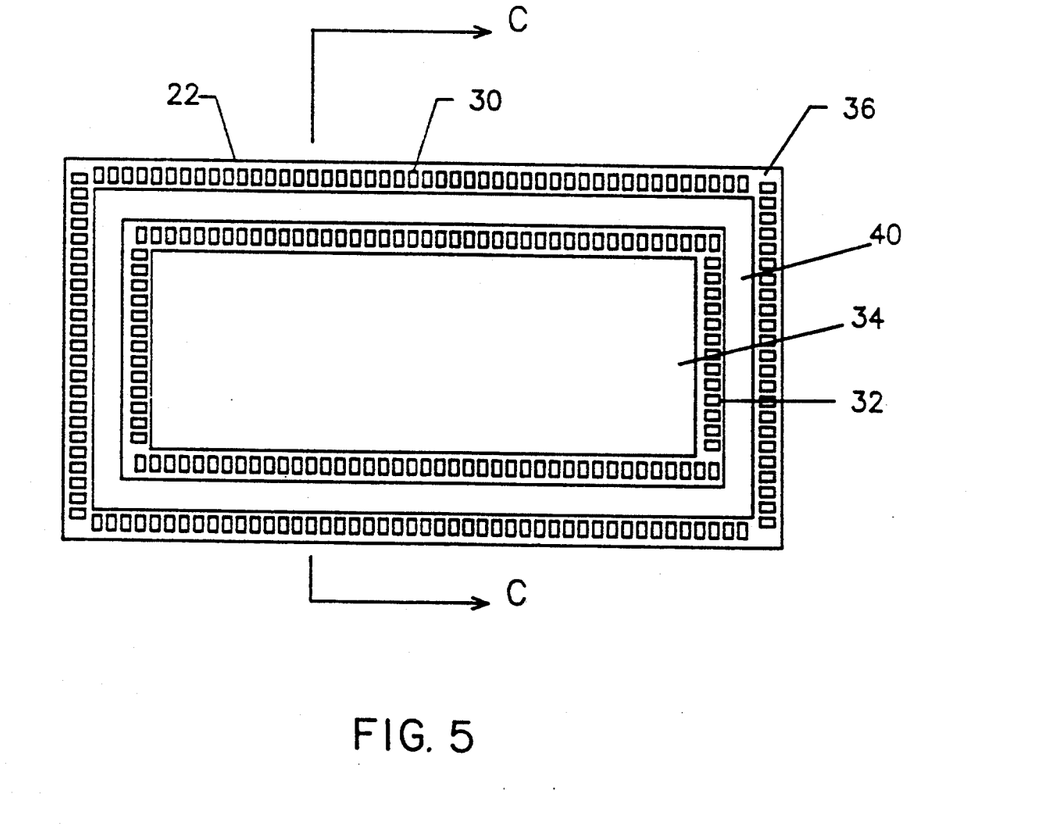
FIG. 5 shows a plan view of the upper base surface metallization for one embodiment of the invention using the lead configuration of FIG. 3.
Figure 6:
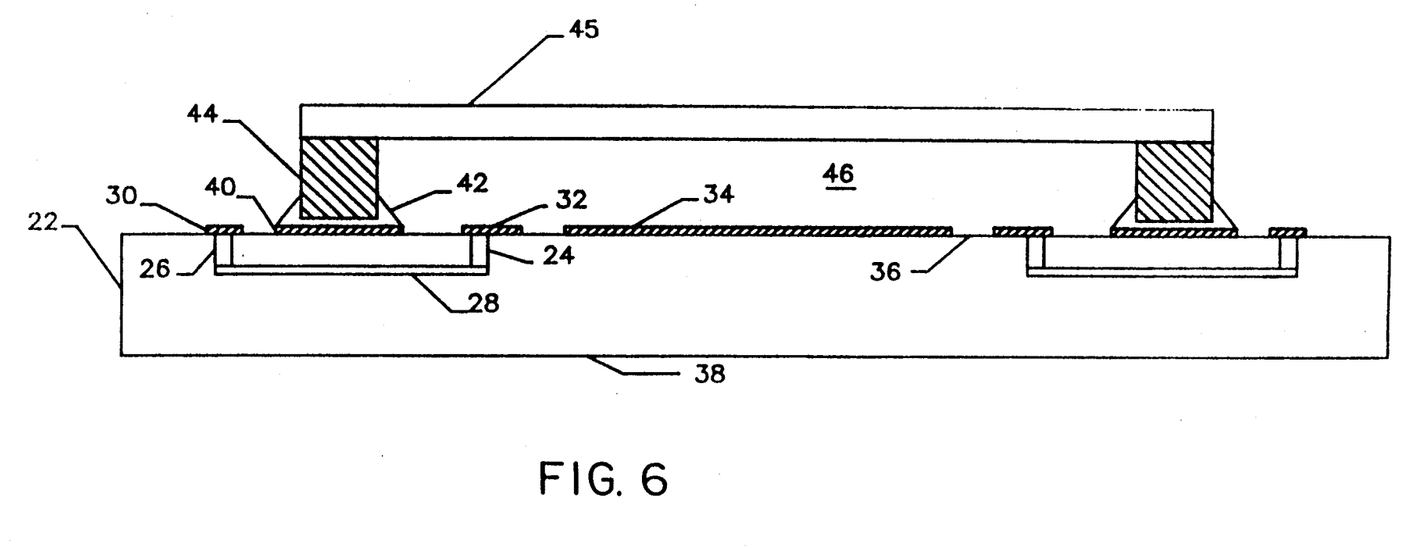
FIG. 6 shows a cross sectional view (not to scale) of the package of FIG. 5 taken at line c—c.

A large perimeter-leaded package was produced according to the design concepts illustrated in FIGS. 3, 5 and 6. It contained an AlN base with co-fired tungsten lead pads. The square base measured approximately 4.2 inch (10.7 cm) on a side with six hundred twelve (612) leads which were 0.012 inch (0.030 cm) wide on 0.025 inch (0.064 cm) centers. Surface metallization consisted of a glass-bonded refractory metallization which contained both tungsten and molybdenum refractory metal constituents. The seal ring was made of molybdenum and was attached using a copper/silver braze alloy.

Production of this package required both AlN and BN green sheet. The method used to produce these sheets is detailed in U.S. Pat. No. 4,920,640, the entire contents of which are incorporated herein by reference. It involves blending the appropriate components listed in Table 1 for the AlN sheet

TABLE 1

| Components for the AlN Extruded Sheet | |
|---|---|
| AlN Powder | 70.0 wt. % |
| $CaCO_3$ Powder | 3.5 wt. % |
| Polyethylene | 5.0 wt. % |
| Mineral Oil | 21.5 wt. % | and the appropriate components for the BN sheets listed in Table 2 below

TABLE 2

| Components for the BN Extruded Sheet | |
|---|---|
| BN Powder | 61.0 wt. % |
| Polyethylene | 6.0 wt. % |
| Mineral Oil | 33.0 wt. % | and extruding them into sheet form at approximately 160° C. to a thickness of approximately 0.028 inch (0.071 cm). The mineral oil was removed from these sheets by extraction in trichloroethane.

The package base preforms were assembled using common processes including tape punching, cutting, and screen printing. In single layer of green sheet, one thousand two hundred and twenty-four (1224) via holes (0.010 inch diameter, 0.025 cm) were punched around the perimeter of the sheet using a numerically controlled punch. These holes were filled with a refractory metal paste by spreading the paste over the via holes using a rubber squeegee and simultaneously pulling a vacuum on the back side of the sheet. The composition of this refractory metal paste is given in Table 3.

TABLE 3

| Composition of the Refractory Metal Paste for Via Fill | | |
|---|---|---|
| | Composition | |
| Description | (wt %) | Component |
| W/Mo/AlN Paste Formulation | 64.4 | W Powder |
| | 11.2 | Mo Powder |
| | 11.9 | AlN Powder |

TABLE 3-continued

| Composition of the Refractory Metal Paste for Via Fill | | |
|---|---|---|
| | Composition | |
| Description | (wt %) | Component |
| | 1.0 | Ethyl Cellulose |
| | 10.5 | α-Terpineol |
| | 1.0 | Dispersant (Troykyd 98-C) |

A refractory metal ink of different composition (listed in Table 4) was used for connecting the via pairs with conductive lines (traces).

TABLE 4

| Composition of the Refractory Metal Ink for Buried Traces. | | |
|---|---|---|
| | Composition | |
| Description | (wt %) | Component |
| W Ink Formulation | 70.3 | W Powder-1.7 μm average particle size |
| | 23.5 | W Powder-0.5 μm average particle size |
| | 0.3 | Ethyl Cellulose |
| | 5.4 | α-Terpineol |
| | 0.5 | Dispersant (Troykyd 98-C) |

These lines were approximately 0.010 inch (0.025 cm) wide and were applied by screen printing.

The AlN package preform was placed in a graphite die with BN sheets on both sides of the preform to protect the AlN from the graphite. The perform was hot pressed to 1800° C. and approximately 500 psi for approximately 4 hours. Afterwards, it was removed from the die and the BN was removed by a grit blasting operation.

Prior to firing the surface refractory metallization, the surface of the hot pressed AlN package base was lapped with a 320 grit diamond wheel to further improve flatness as well as uniformity of the surface roughness. The surface metallization was applied to the lapped AlN surface by screen printing. It was important to carefully position the screen such that the lead pads were directly over the vias protruding to the surface of the AlN base. The surface refractory metallization used was a tungsten-based metallization sold by Crystalero Inc. of Sunnyvale, Calif. under the name, Crystalero 4000W.

Firing conditions were 1300° C. for 45 minutes in a wet 75% hydrogen/25% nitrogen atmosphere.

Nickel plating was required for wetting of the braze alloy to the surface metallization. This was applied using common techniques, including an electrolytic Ni strike, followed by an electroless deposition of a nickel layer. Thickness of the Ni layer was approximately 5 microns. This layer was fired to approximately 850° C. for 5 minutes to adhere the nickel to the surface refractory metallization.

A molybdenum seal ring having outer dimensions of approximately 4 inch×4 inch (10 cm×10 cm) and a cross-section of 0.050 inch by 0.100 inch (0.127 cm by 0.254 cm) was attached to the seal ring area on the surface of the package using a copper/silver braze alloy foil. The composition of this alloy is approximately 72 wt.% silver and 28 wt.% copper. The firing temperature for the brazing operation was approximately 800° C.

It is understood that the foregoing detailed description is given merely by way of illustration and that many variations may be made therein without departing from the spirit of this invention.

What is claimed is:

1. A hermetically sealed perimeter-leaded package for maintaining a substrate containing integrated circuit devices in an electrically accessible, hermetically sealed environment comprising
    a) a flat monolithic aluminum nitride base, said base having a flat upper surface and a flat lower surface;
    b) a hermetic zone on at least a portion of said upper surface, said zone being adapted to house said substrate;
    c) a seal ring surrounding and defining said zone;
    d) a cover adapted to be hermetically sealed to said seal ring thereby covering and further defining said zone;
    e) a plurality of conductive vias extending from said upper surface said zone toward said lower surface; and
    f) a plurality of perimeter conductive lead pads located on said upper surface in said zone about the perimeter of said zone inside said seal ring; wherein
    (1) said perimeter lead pads are electrically connected to said inner vias,
    (2) said inner vias are electrically connected to at least one surface of said base outside said hermetic zone, and
    (3) the package has lateral dimension greater than or equal to about four inches.

2. The package of claim 1 wherein at least one of said inner vias extends down to said lower surface.

3. The package of claim 1 further comprising:
    g) a plurality of conductive vias (outer vias) extending from said upper surface outside said seal ring, toward said lower surface;
    h) a plurality of conductive traces connecting said inner and outer vias; and
    i) a plurality of outer conductive lead pads located on said upper surface in an area outside said seal ring; wherein
    the outer vias, connecting traces and inner vias, in combination, form hermetic, electrically conductive paths for transmitting electrical current into and out of said zone.

4. The package of claim 1 further comprising:
    j) an array of lead pads on said lower surface wherein at least one of said inner vias is electrically connected to at least one pad of said array.

5. The package of claim 2 further comprising:
    j) an array of lead pads on said lower surface wherein at least one of said inner vias is electrically connected to at least one pad of said array.

6. The package of claim 1 wherein said cover is metal.

7. The package of claim 1 wherein said vias and connecting traces contain metallization.

8. The package of claim 7 wherein said perimeter lead pads and seal ring contain metallization.

9. The package of claim 1 further comprising (k) a layer of metallization on said upper surface within said zone, said layer being adapted for attachment of said substrate thereto.

10. The package of claim 1 wherein the spacing between leads is less than or equal to about 30 mils.

11. The package of claim 10 wherein the spacing between leads is less than or equal to about 25 mils.

12. The package of claim 11 wherein the spacing between leads is less than or equal to about 20 mils.

* * * * *